(12) United States Patent
Shim (10) Patent No.: US 7,838,955 B2
(45) Date of Patent: Nov. 23, 2010

(54) IMAGE SENSOR AND METHOD FOR MANUFACTURING THE SAME

(75) Inventor: Hee Sung Shim, Gangneung-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/343,324

(22) Filed: Dec. 23, 2008

(65) Prior Publication Data

US 2009/0166786 A1 Jul. 2, 2009

(30) Foreign Application Priority Data

Dec. 28, 2007 (KR) ...................... 10-2007-0139747
Jun. 30, 2008 (KR) ...................... 10-2008-0062717

(51) Int. Cl.
*H01L 31/058* (2006.01)
(52) U.S. Cl. ...................... 257/440; 257/226; 257/227; 257/258; 257/293; 257/E31.079; 257/E31.084; 257/E31.083
(58) Field of Classification Search .................. 257/226, 257/227, 228, 233, 258, 257, 292, 293, 440, 257/E31.078, E31.079, E31.081, E31.117, 257/E27.083, E27.133, E27.134, E27.142, 257/E27.153, E27.154
See application file for complete search history.

(56) References Cited

U.S. PATENT DOCUMENTS

| | | |
|---|---|---|
| 6,852,565 B1 | 2/2005 | Zhao |
| 6,930,336 B1 * | 8/2005 | Merrill ...................... 257/292 |
| 6,960,757 B2 | 11/2005 | Merrill et al. |
| 7,544,560 B2 | 6/2009 | Noh |

FOREIGN PATENT DOCUMENTS

| | | |
|---|---|---|
| CN | 1820349 A | 8/2006 |
| CN | 1957599 A | 5/2007 |
| KR | 1 10-2005-0117674 A | 12/2005 |
| KR | 10-0889365 B1 | 12/2005 |

(Continued)

OTHER PUBLICATIONS

Sang Yun Lee; "Image Sensor of Three-Dimensional Structure Using Depletion Region for Improving Yield and Manufacturing Method Thereof"; Abstract for Patent Publication No. 1020050117674 A; Publication Date: Dec. 15, 2005; Korean Intellectual Property Office; Republic of Korea.

(Continued)

*Primary Examiner*—Julio J Maldonado
(74) *Attorney, Agent, or Firm*—The Law Offices of Andrew D. Fortney; Andrew D. Fortney (57) ABSTRACT

An image sensor includes a metal interconnection and readout circuitry over a first substrate, an image sensing device, and an ion implantation isolation layer. The image sensing device is over the metal interconnection, and an ion implantation isolation layer is in the image sensing device. The image sensing device includes first, second and third color image sensing units, and ion implantation contact layers. The first, second and third color image sensing units are stacked in or on a second substrate. The ion implantation contact layers are electrically connected to the first, second and third color image sensing units, respectively.

10 Claims, 10 Drawing Sheets

FOREIGN PATENT DOCUMENTS

| KR | 10-2007-0019452 A | 2/2007 |
|---|---|---|
| WO | 2005/120048 A1 | 12/2005 |

OTHER PUBLICATIONS

Korean Office Action dated Feb. 26, 2008; Korean Patent Application No. 10-2007-0139747; Korean Intellectual Property Office, Republic of Korea.

Hyun Pil Noh; "Image Sensor Using Charge Flow Preventing Region and Manufacturing Method Thereof"; Korean Patent Abstracts; Publication No. 1020070019452 A; Publication Date: Feb. 15, 2007; Korean Intellectual Property Office, The Republic of Korea.

Sang Yun Lee; "3-Dimensional Solid-State Image Sensor and Method of Making the Same"; espacenet—Bibliographic data; Publication No. KR100889365 (B1); Publication Date: Dec. 15, 2005; espacenet Database—Worldwide.

James Merrill and Richard B Hanneb; "Simplified Wiring Schemes for Vertical Color Filter Pixel Sensors"; espacenet; Chinese Publication No. CN1957599 (A); Publication Date: May 2, 2007; espacenet Database—Worldwide.

Zhao Linxin; "An Image Sensor with a Vertical Overflow Drain and Short Micro-Lens to Silicon Distance"; espacenet; Chinese Publication No. CN1820349 (A); Publication Date: Aug. 16, 2006; espacenet Database—Worldwide.

English Translation of Chinese Office Action dated Feb. 5, 2010; Chinese Patent Application No. 200810189137.0; 2 pages; The State Intellectual Property Office of P.R.C., The People's Republic of China.

Korean Office Action dated Aug. 26, 2008; Korean Patent Application No. 10-2008-0062717; 6 pages; Korean Intellectual Property Office, The Republic of Korea.

* cited by examiner

IMAGE SENSOR AND METHOD FOR MANUFACTURING THE SAME

The present application claims under 35 U.S.C. §119 to Korean Patent Application No. 10-2007-0139747 (filed Dec. 28, 2007) and 10-2008-0062717 (filed Jun. 30, 2008), which are hereby incorporated by reference in their entireties.

BACKGROUND

An image sensor is a semiconductor device for converting optical images into electrical signals. Image sensors may be classified into charge coupled device (CCD) image sensors and complementary metal oxide silicon (CMOS) image sensors (CIS).

During the fabrication of image sensors, a photodiode may be formed in a substrate using ion implantation. As the size of a photodiode is reduced for the purpose of increasing the number of pixels without increasing chip size, the area of a light receiving portion may also reduced, thereby resulting in a reduction in image quality.

Also, since a reduction in stack height may not be proportionate to a reduction in the area of the light receiving portion, the number of photons incident to the light receiving portion may also be reduced due to diffraction of light called airy disk.

To overcome this limitation, methods including forming a photodiode using amorphous silicon (Si), or forming readout circuitry in a silicon (Si) substrate using a method such as wafer-to-wafer bonding, and forming a photodiode on the readout circuitry have been employed (referred to as a "three-dimensional (3D) image sensor"). The photodiode may be connected to the readout circuitry through a metal interconnection.

In the related art image sensor, a metal interconnection may be formed on the readout circuitry, and a wafer-to-wafer bonding may be performed such that the photodiode contacts the metal interconnection. However, it may be difficult to properly achieve a contact between the photodiode and the metal interconnection during the wafer-to-wafer bonding.

Moreover, in the related art image sensor, there may be difficulty in electrically isolating a contact for one color from a contact for another color in a stacked RGB photodiode configuration (e.g., containing red, green and blue photodiodes in a vertical arrangement).

Since both the source and the drain on opposite sides of the transfer transistor may be heavily doped with N-type impurities, a charge sharing phenomenon may occur. When a charge sharing phenomenon occurs, the sensitivity of an output image may be reduced and an image error may be generated. Also, because photocharges do not readily move between the photodiode and the readout circuitry, a dark current may be generated and saturation and/or sensitivity may be reduced.

SUMMARY

Embodiments of the present invention relate to an image sensor and a manufacturing method thereof that can improve a physical contact between a photodiode and a metal interconnection, and also obtain ohmic contact therebetween.

Embodiments of the present invention relate to an image sensor and a manufacturing method thereof that can electrically isolate a contact for one color from a contact for another color effectively in a stacked RGB photodiode.

Embodiments of the present invention relate to an image sensor and a manufacturing method thereof that can prevent occurrence of charge sharing while increasing a fill factor.

Embodiments of the present invention relate to an image sensor and a manufacturing method thereof that minimize a dark current source and can prevent reduction in saturation and/or sensitivity by providing a swift movement path for a photocharge between a photodiode and readout circuitry.

Embodiments of the present invention relate to an image sensor that may include a metal interconnection and readout circuitry over a first substrate; an image sensing device over the metal interconnection; and an ion implantation isolation layer in the image sensing device, wherein the image sensing device includes first, second and third color image sensing units stacked in or on a second substrate; and ion implantation contact layers electrically connected to the first, second and third color image sensing units, respectively.

Further embodiments of the present invention relate to a method for manufacturing an image sensor that may include forming a metal interconnection and readout circuitry over a first substrate; forming an image sensing device over a second substrate; forming an ion implantation isolation layer in the image sensing device; and bonding the first and second substrates to each other to allow the image sensing device to contact the metal interconnection, wherein forming the image sensing device includes: stacking first, second and third color image sensing units in or on the second substrate; and forming ion implantation contact layers electrically connected to the first, second and third color image sensing units, respectively.

DESCRIPTION

An image sensor and a method for manufacturing an image sensor in accordance with embodiments of the present invention will be described in detail with reference to the accompanying drawings.

In the description of embodiments of the present invention, it will be understood that when a layer (or film) is referred to as being 'on' another layer or substrate, it can be directly on another layer or substrate, or one or more intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
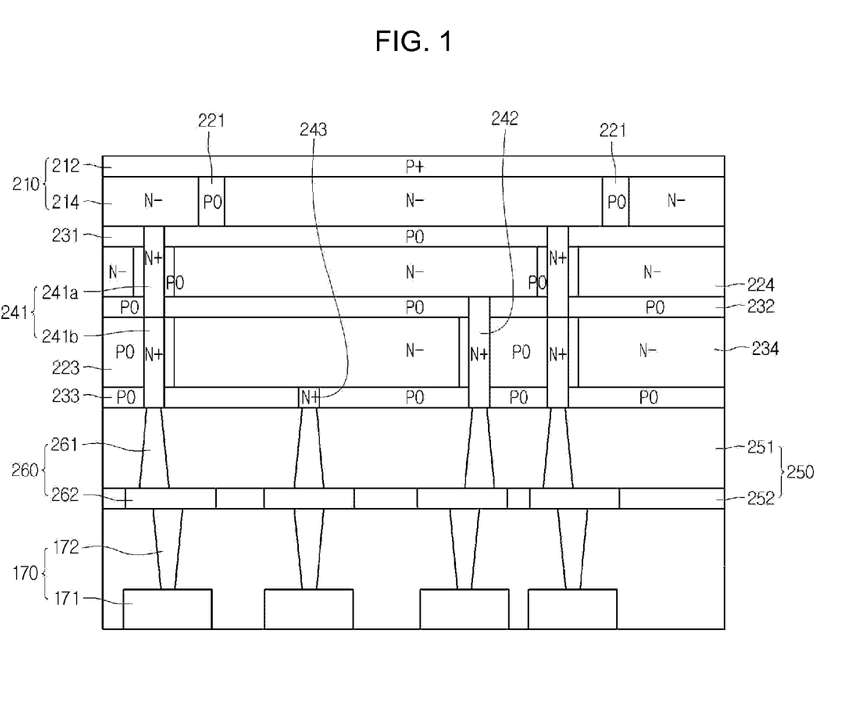
FIGS. 1 to 17 illustrate an exemplary image sensor and an exemplary method for manufacturing an image sensor in accordance with embodiments of the present invention.

FIG. 1 is a sectional view of an exemplary image sensor in accordance with embodiments of the present invention.

As illustrated in FIG. 1, an image sensor may include: metal interconnection 170 and readout circuitry (not shown) over a first substrate (not shown); an image sensing device on metal interconnection 170; and an ion implantation isolation layer in the image sensing device. The image sensing device can include: first image sensing unit 210, second image sensing unit 224, and third color image sensing unit 234 that are stacked on second substrate (not present); and ion implantation contact layers electrically connected to first, second and third color image sensing units 210, 224 and 234, respectively.

The image sensing device may be, but is not limited to, a photodiode, a photogate or any combination thereof. Although embodiments of the present invention described herein provide a photodiode formed in a crystalline semiconductor layer, the photodiode is not limited thereto but, for example, may be formed in an amorphous semiconductor layer.

Non-described numerals of FIG. 1 will be described in the following manufacturing method section.

Hereinafter, an exemplary method for manufacturing an image sensor in accordance with embodiments of the present invention will be described with reference to FIGS. 2 to 16.

Figure 2:
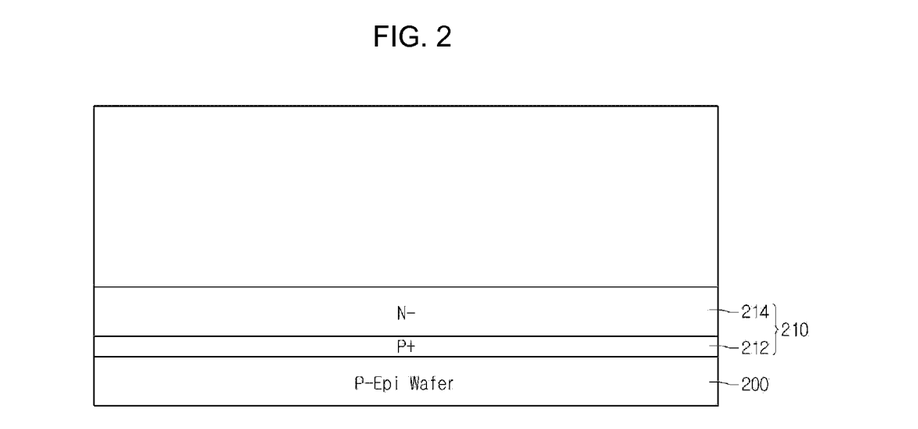

As illustrated in FIG. 2, first color photodiode 210 may be formed on a crystalline semiconductor layer of second substrate 200. Forming first color photodiode 210 may comprise: forming second conduction type conduction layer 212 (hereinafter, also referred to as 'P+ layer') on the crystalline semiconductor layer of second substrate 200; and forming first conduction type conduction layer 214 (hereinafter, also referred to as 'first N− layer') on second conduction type conduction layer 212. P+ layer 212 and first N− layer 214 can be formed by implanting impurity ions into second substrate 200, e.g., P-type epitaxial layer or P-type well without a photomask. First N− layer 214 may serve as a red color photodiode, but is not limited thereto.

Figure 3:
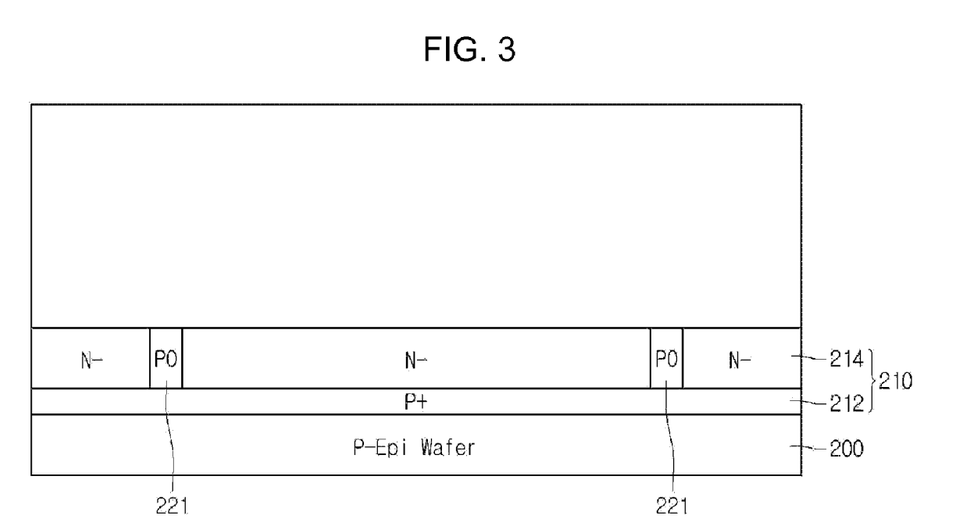

Thereafter, as illustrated in FIG. 3, an ion implantation isolation layer may be formed in first N− layer 214. The ion implantation isolation layer can include a vertical ion implantation isolation layer. For example, first vertical ion implantation isolation layer 221 (hereinafter, also referred to as 'first vertical P0 layer') can be formed at an interface between pixels of first color photodiode 214. First vertical P0 layer 221 can be formed using a photolithographic process and an ion implantation process. First vertical P0 layer 221 may be used for pixel-to-pixel isolation of first N− layer 214 when used as a photodiode, and may also be used for connection of a ground line (not shown).

Figure 4:
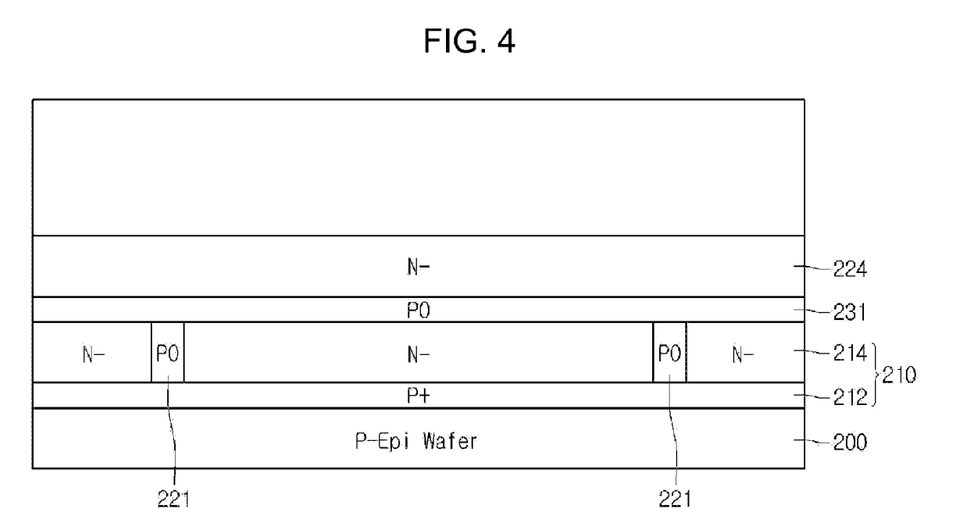

Afterwards, as illustrated in FIG. 4, first horizontal ion implantation isolation layer 231 (hereinafter, also referred to as 'first horizontal P0 layer') may be formed on first color photodiode 214. First horizontal P0 layer 231 can be formed using an ion implantation process without a photomask. First horizontal P0 layer 231 can isolate photodiodes from each other.

Next, second color photodiode 224 (hereinafter, also referred to as 'second N− layer') may be formed on first horizontal ion implantation isolation layer 231. Second N− layer 224 can be formed on first horizontal P0 layer 231 using an ion implantation process without a photomask. Second N− layer 224 can serve as a green photodiode, but is not limited thereto.

Figure 5:
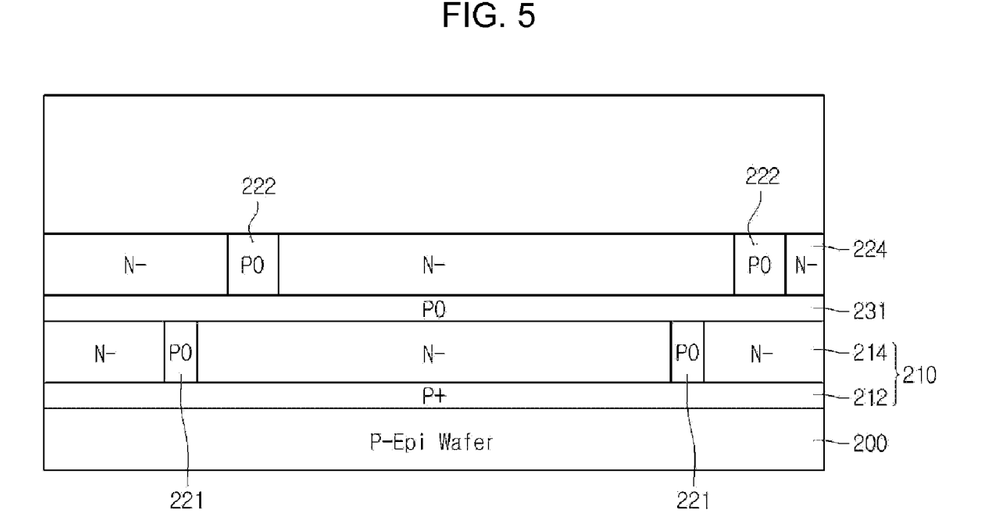

After that, as illustrated in FIG. 5, second vertical ion implantation isolation layer 222 (hereinafter, also referred to as 'second vertical P0 layer') may be formed at an interface between pixels of second color photodiode 224. Second vertical P0 layer 222 can be formed using a photolithographic process and an ion implantation process.

Figure 6:
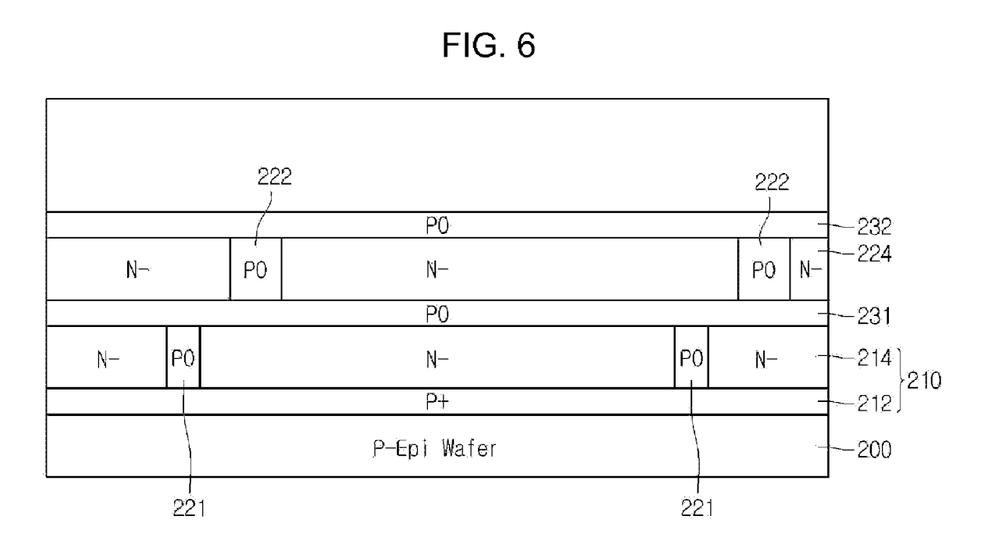

Thereafter, as illustrated in FIG. 6, second horizontal ion implantation isolation layer 232 may be formed on second color photodiode 224. Second vertical P0 layer 232 can be formed using an ion implantation process without a photomask.

Figure 7:
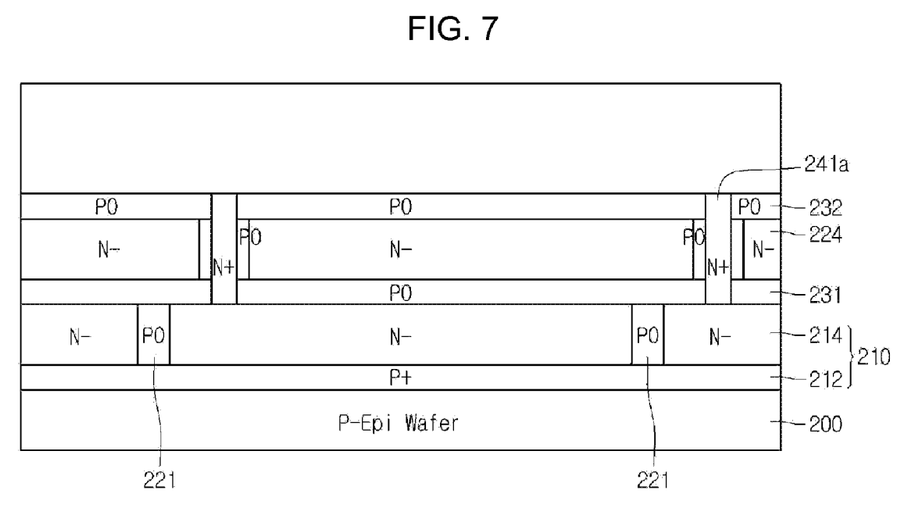

Afterwards, as illustrated in FIG. 7, an ion implantation contact layer electrically connected to first color photodiode 214 can be formed. For example, first lower ion implantation contact layer 241a (hereinafter, also referred to as 'first lower N+ layer') can be formed such that it extends through second vertical ion implantation isolation layer 222 to contact first color photodiode 214. For example, by the use of a photolithographic process and an ion implantation process, first lower N+ layer 241a can be formed in such a shape that it extends through second vertical P0 layer 222 to contact first N− layer 214. First lower N+ layer 241a may be a plug ion implantation layer for picking up electrons from first N− layer 214 used as the photodiode.

Figure 8:
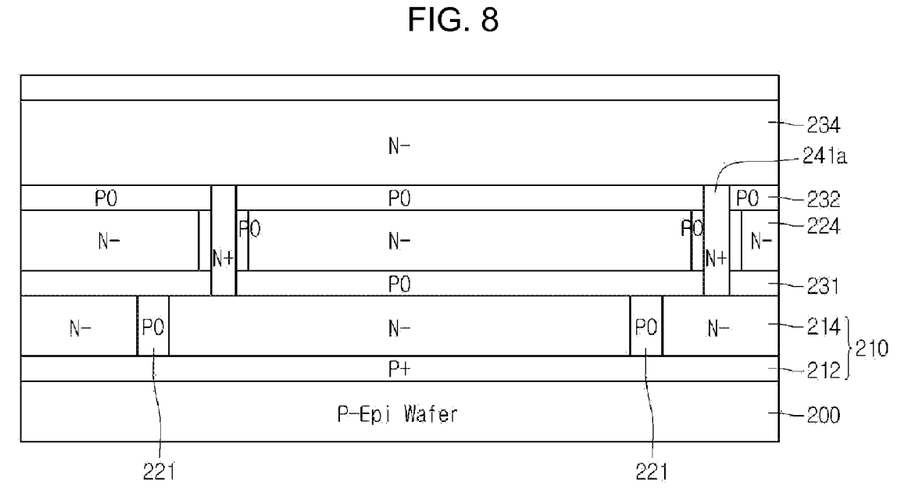

Next, as illustrated in FIG. 8, third color filter 234 (hereinafter, also referred to as 'third N− layer') may be formed on first lower ion implantation contact layer 241a. Third N− layer 234 can be formed on first lower N+ layer 241a using a photolithographic process and an ion implantation process. Third N− layer 234 can serve as a blue photodiode, but is not limited thereto.

Figure 9:
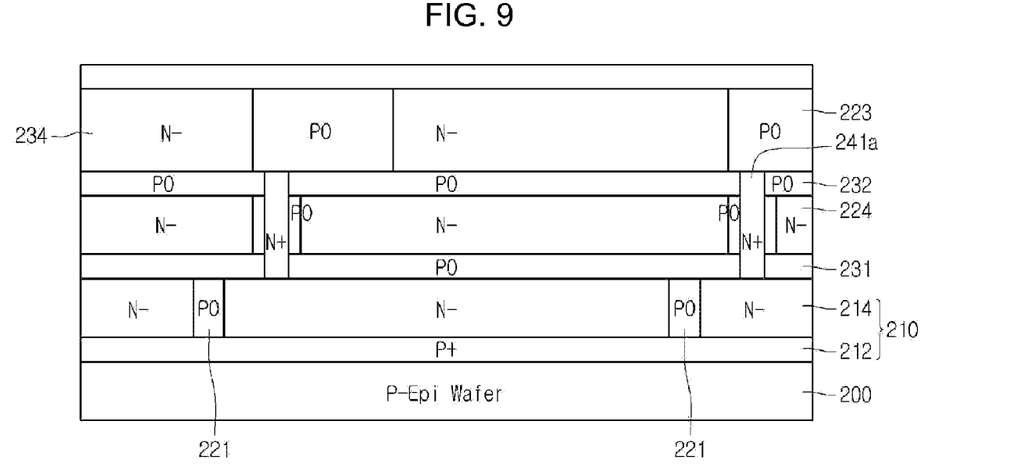

After that, as illustrated in FIG. 9, third vertical ion implantation isolation layer 223 (hereinafter, also referred to as 'third vertical P0 layer') can be formed at an interface between pixels of third color photodiode 234. Third vertical P0 layer 223 can be formed using a photolithographic process and an ion implantation process. Third vertical ion implantation isolation layer 223 can be formed on first lower ion implantation contact layer 241a, and can have a width greater than second vertical ion implantation isolation layer 222.

Figure 10:
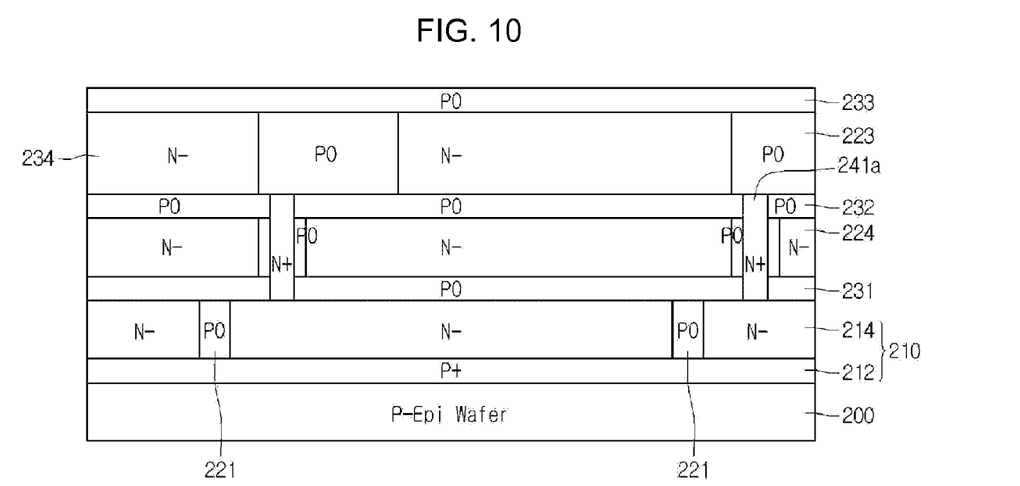

Thereafter, as illustrated in FIG. 10, third horizontal ion implantation isolation layer 233 (hereinafter, also referred to as 'third horizontal P0 layer') may be formed on third color photodiode 234. Third horizontal P0 layer 233 can be formed using an ion implantation process without a photomask.

Figure 11:
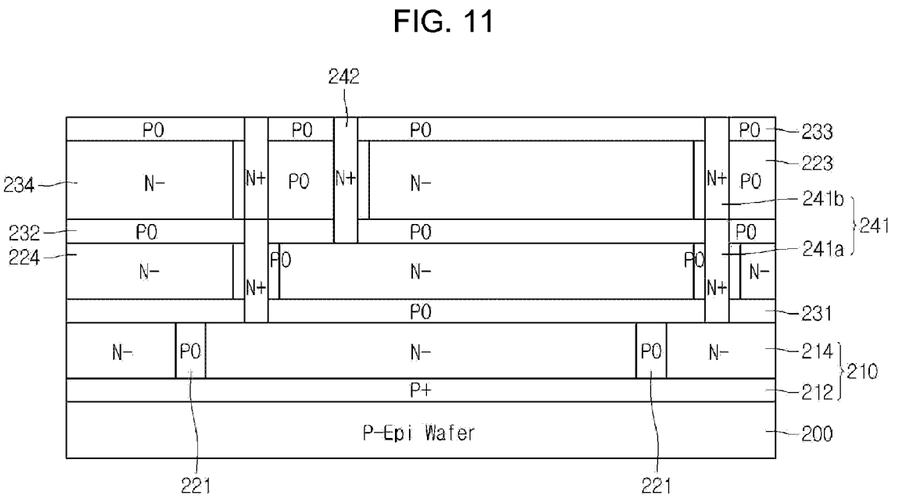

Afterwards, as illustrated in FIG. 11, a second ion implantation contact layer 242 (hereinafter, also referred to as 'second N+ layer') that is electrically connected to second color photodiode 224 can be formed. For example, second ion implantation contact layer 242 can be formed such that it extends through third horizontal ion implantation isolation layer 233 and third vertical ion implantation isolation layer 223 to thereby contact second color photodiode 224. First upper ion implantation contact layer 241b (hereinafter, also referred to as 'first upper N+ layer') connected to first lower ion implantation contact layer 241a can be formed simultaneously with second ion implantation contact layer 242, but is not limited thereto.

For example, second N+ layer 242 can be formed in such a shape that it extends through third horizontal P0 layer 233 and third vertical P0 layer 223 to contact second N− layer 224, by using a photolithographic process and an ion implantation process. At this time, first upper N+ layer 241b connected to first lower N+ layer 241a can be formed simultaneously with second ion implantation contact layer 242.

Figure 12:
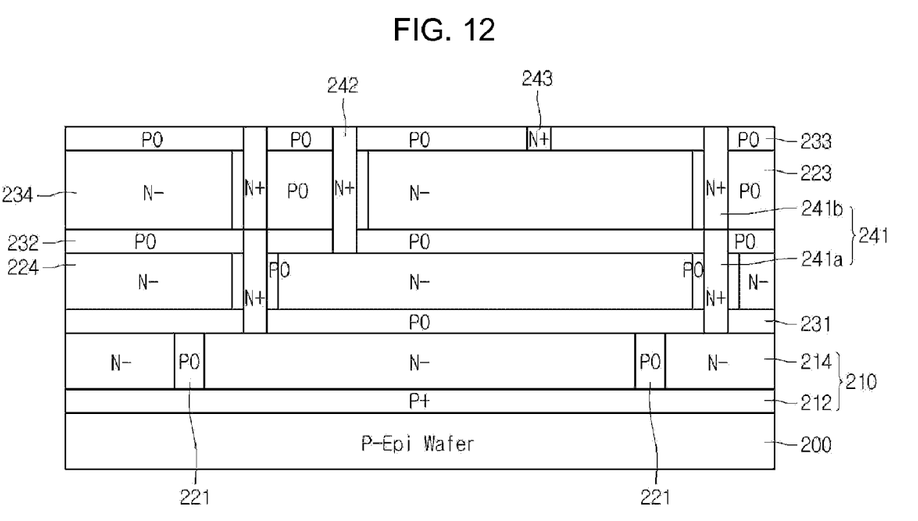

Next, as illustrated in FIG. 12, a third ion implantation contact layer 243 (hereinafter, also referred to as third N+ layer) electrically connected to third color photodiode 234 can be formed. For example, third ion implantation contact layer 243 can be formed such that it extends through third horizontal ion implantation contact layer 233 to contact third color photodiode 234. Third N+ layer 243, which may extend through third horizontal P0 layer 233 to contact third N− layer 234, can be formed using a photolithographic process and an ion implantation process.

FIG. 12 is a sectional view of an image sensor after completing an ion implantation process which may form an RGB stacked pixel configuration (e.g., containing vertically disposed red, green and blue photodiodes). The N− layers may be arranged in vertical and horizontal directions, and may serve as photodiodes; and the P0 layers may isolate pixels in horizontal and vertical directions from each other, and may also serve as a ground line. Also, N+ layer 230 may serve as an electron movement path of electrons generated from pixels.

Since an image sensor in accordance with embodiments of the present invention having the above structure may employ an ion implantation contact layer formed through the aforesaid process, the ion implantation contact layer for electron pick-up may be electrically connected to the photodiode for a corresponding color, and may simultaneously extend through the ion implantation isolation layer. Accordingly, a photodiode for one color can be electrically isolated from another pixel or photodiode for another color effectively in an aspect of structure and process.

Figure 13:
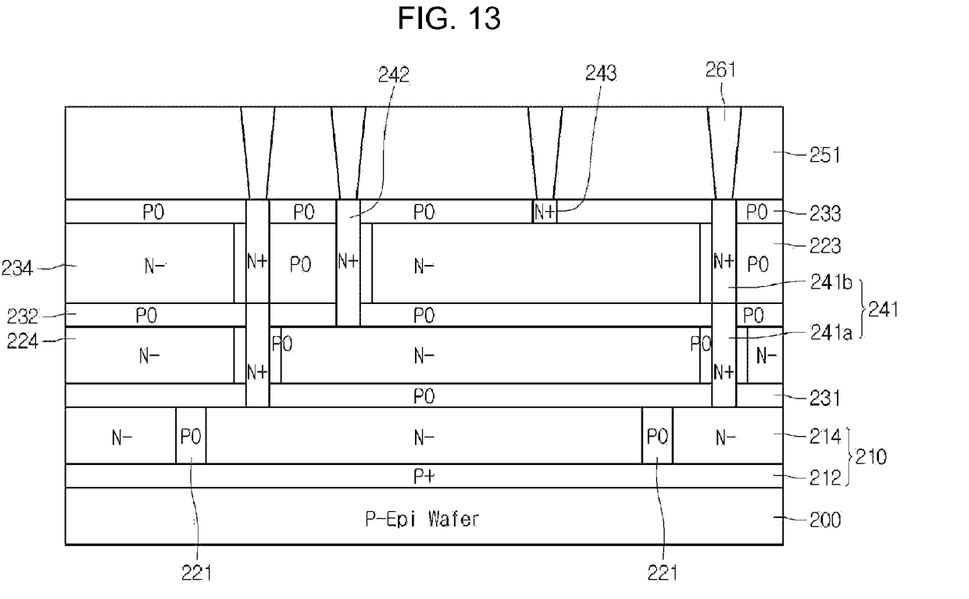

After that, as illustrated in FIG. 13, first dielectric 251 may be formed over vertical type N+ layers, and selectively patterned to thereby form metal plug 261 that may be electrically connected to third ion implantation contact layer 243. First dielectric layer 251 may comprise an oxide, and metal plug 261 may comprise tungsten, but they are not limited thereto.

Figure 14:
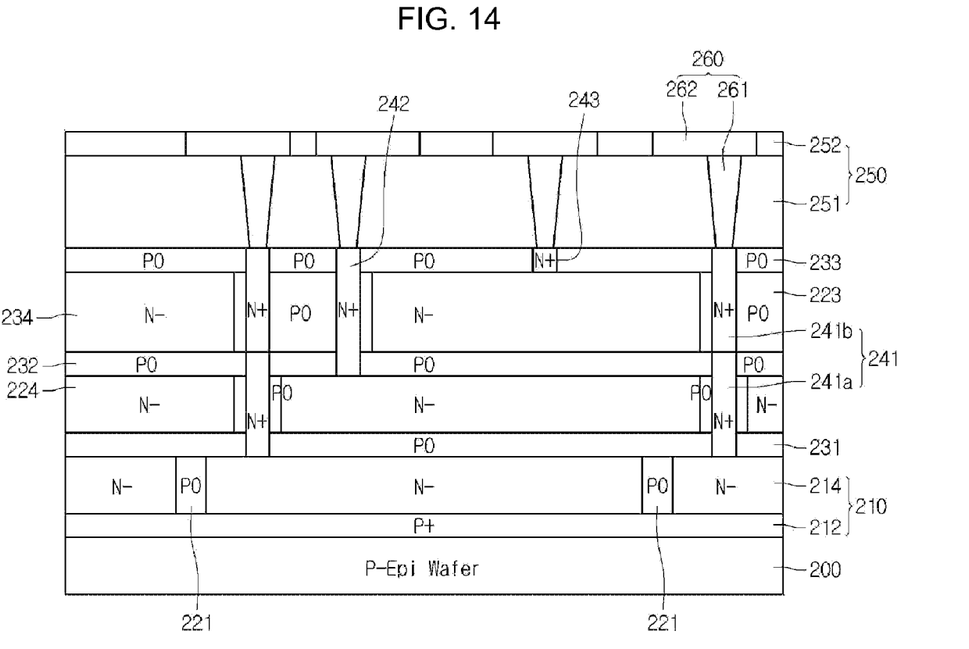

Thereafter, as illustrated in FIG. 14, second dielectric 252 can be formed on first dielectric 251, and selectively patterned to form metal line 262 connected to metal plug 261. For example, second dielectric 252 may comprise an oxide (e.g., silicon dioxide), and metal line 262 may comprise tungsten, aluminum and/or copper, but they are not limited thereto. Accordingly, in manufacturing an image sensor employing a vertical type photodiode in accordance with embodiments of the present invention, it is possible to improve the bondability and the alignment margin between substrates by bonding the substrates to each other after the formation of the dielectric and the metal pad.

Figure 15A:
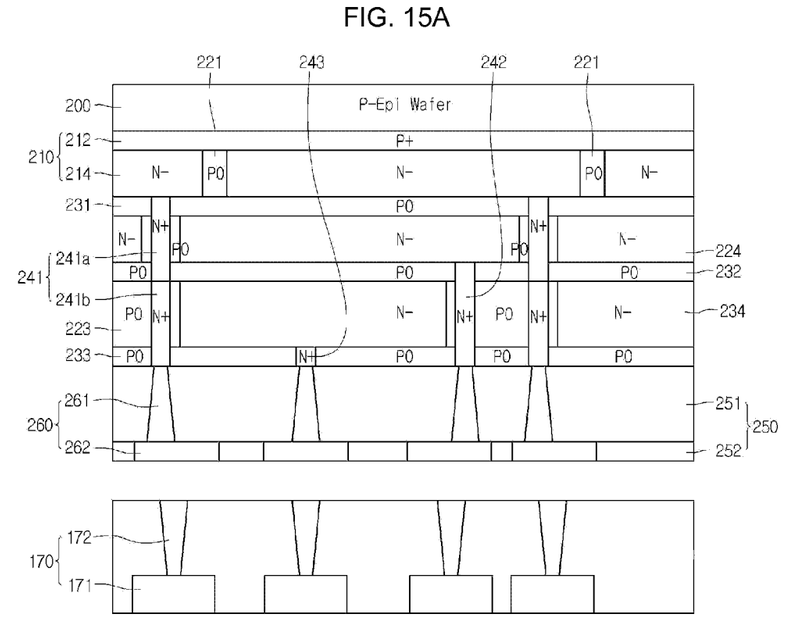

Afterwards, as illustrated in FIG. 15A, readout circuitry (not shown) including metal interconnection 170 may be formed on a first substrate (not shown) and the first substrate and second substrate 200 may be bonded to each other such that metal line 262 contacts metal interconnection 172. Bonding may be performed by placing the first substrate and second substrate 200 in contact with each other and then performing activation by plasma to increase a surface energy in a bonding surface.

Figure 15B:
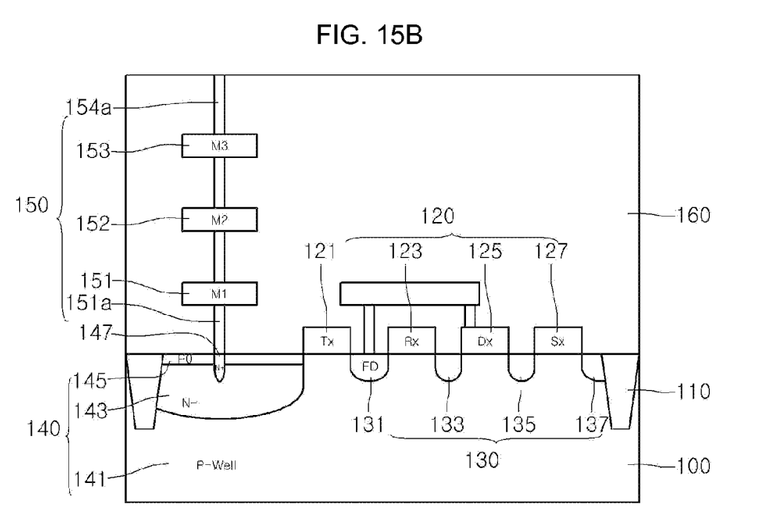

FIG. 15B is a detailed view of first substrate 100 including metal interconnection 150 and readout circuitry 120. Hereinafter, a method for manufacturing first substrate 100 including metal interconnection 150 and readout circuitry 120 will be described in detail with reference to example FIG. 15B.

First substrate 100 may be formed, over which metal interconnection 150 and readout circuitry 120 may be formed. First substrate 100 may be, but is not limited to, a second conduction type substrate. Device isolation layer 110 may be formed in second conduction type first substrate 100 to thereby define an active region. Readout circuitry 120 which may include at least one transistor may be formed in the active region. For example, readout circuitry 120 may include transfer transistor (Tx) 121, reset transistor (Rx) 123, drive transistor (Dx) 125 and select transistor (Sx) 127. Ion implantation regions 130 can then be formed, which may include floating diffusion region (FD) and source/drain regions 133, 135 and 137 of respective transistors.

Forming readout circuitry 120 on first substrate 100 may include forming an electrical junction region 140 in first substrate 100 and forming first conduction type connection region in an upper region of electrical junction region 140 which may be electrically connected to metal interconnection 150.

Electrical junction region 140 may be, but is not limited to, a PN junction. For example, electrical junction region 140 may include first conduction type ion implantation layer 143, formed on second conduction type well 141 or a second conduction type epitaxial layer, and second conduction type ion implantation layer 145 formed on first conduction type ion implantation layer 143. As illustrated in FIG. 15B, PN junction 140 may be, but is not limited to, a P0 (145)/N− (143)/P− (141) junction. First substrate 100 may be, but is not limited to, a second conduction type substrate.

In accordance with embodiments of the present invention, a device may be designed such that there is a potential difference between the source and drain on both sides of transfer transistor (Tx) 121 so that a photocharge can be fully dumped or transferred. Accordingly, a photocharge generated from the photodiode may be fully dumped or transferred to the floating diffusion region so that the sensitivity of an output image can be increased.

Electrical junction region 140 may be formed in first substrate 100 where readout circuitry 120 is formed to allow a potential difference to be generated between the source and the drain on both sides of transfer transistor (Tx) 121 so that a photocharge can be fully dumped or transferred.

Hereinafter, a dumping structure of a photocharge in accordance with embodiments is described in detail.

Unlike floating diffusion (FD) node 131, which may be an N+ junction, P/N/P junction 140, which is electrical junction region 140, and to which an applied voltage may not be fully transferred, may be pinched-off at a predetermined voltage. This voltage may be called a pinning voltage, which depends on the doping concentrations of P0 region 145 and N− region 143.

Specifically, an electron generated from the photodiode 210 moves to the PNP junction 140, and is transferred to the floating diffusion (FD) node 131 and converted into a voltage when the transfer transistor (Tx) 121 is turned on.

Since a maximum voltage value of P0/N−/P− junction 140 becomes a pinning voltage, and a maximum voltage value of the floating diffusion node (FD) 131 becomes a voltage value obtained by subtracting a threshold voltage (Vth) of reset transistor (Rx) 123 from Vdd voltage, an electron generated from photodiode 210 in the upper portion of a chip can be fully dumped or transferred to the floating diffusion node (FD) 131 without charge sharing by a potential difference between both sides of transfer transistor (Tx) 121.

Thus, in accordance with embodiments of the present invention, a P0/N−/P-well junction, rather than an N+/P-well junction, may be formed in a silicon substrate such as first substrate 100 to allow a positive (+) voltage to be applied to N− 143 of the P0/N−/P-well junction and a ground voltage to be applied to P0 145 and P-well 141 during a 4-Tr active pixel sensor (APS) reset operation, so that a pinch-off may be generated to the P0/N−/P-well double junction at a predetermined voltage or more as in a bipolar junction transistor (BJT) structure. This may be called a pinning voltage. Therefore, a potential difference may be generated between the source and the drain at both sides of transfer transistor (Tx) 121 to prevent a charge sharing phenomenon during the on/off operations of transfer transistor (Tx) 121.

Therefore, unlike a case where a photodiode is simply connected to an N+ junction, limitations such as saturation reduction and/or sensitivity reduction can be avoided or mitigated in accordance with embodiments of the present invention.

Next, first conduction type connection region 147 may be formed between the photodiode and the readout circuitry to provide a swift movement path of a photocharge, so that a dark current source is minimized, and saturation reduction and/or sensitivity reduction can be reduced or prevented.

For this purpose, first conduction type connection region 147 for ohmic contact, for example, N+ region 147 can be formed on the surface of P0/N−/P− junction 140. N+ region 147 can be formed to extend through P0 region 145 and contact N− region 143.

In order to prevent first conduction type connection region 147 from becoming a leakage source, the width of first conduction type connection region 147 can be minimized. Therefore, a plug implant can be performed after first metal contact 151a is etched, but a process is not limited thereto. For example, an ion implantation pattern may be formed and first conduction type connection region 147 may then be formed using the ion implantation pattern as an ion implantation mask.

A reason for locally and heavily doping only a contact forming portion with N-type impurities in accordance with embodiments of the present invention is to facilitate ohmic contact formation while minimizing a dark signal. In the case of heavily doping the entire transfer transistor source, the dark signal may be increased by dangling bonds at the Si surface.

Next, interlayer dielectric 160 can be formed on first substrate 100. Metal interconnection 150 can then be formed extending through interlayer dielectric 160 and electrically connected to first conduction type connection region 147. Metal interconnection 150 can include, but is not limited to, first metal contact 151a, first metal 151, second metal 152, third metal 153 and fourth metal contact 154a. Interlayer dielectric 160 may comprise an oxide (e.g., silicon dioxide, which may be undoped or doped with fluorine or with boron and/or phosphorous), nitride (e.g., silicon nitride), or a laminate thereof (e.g., a silicon nitride/undoped silicate glass/fluorosilicate glass/undoped silicate glass stack).

Figure 16:
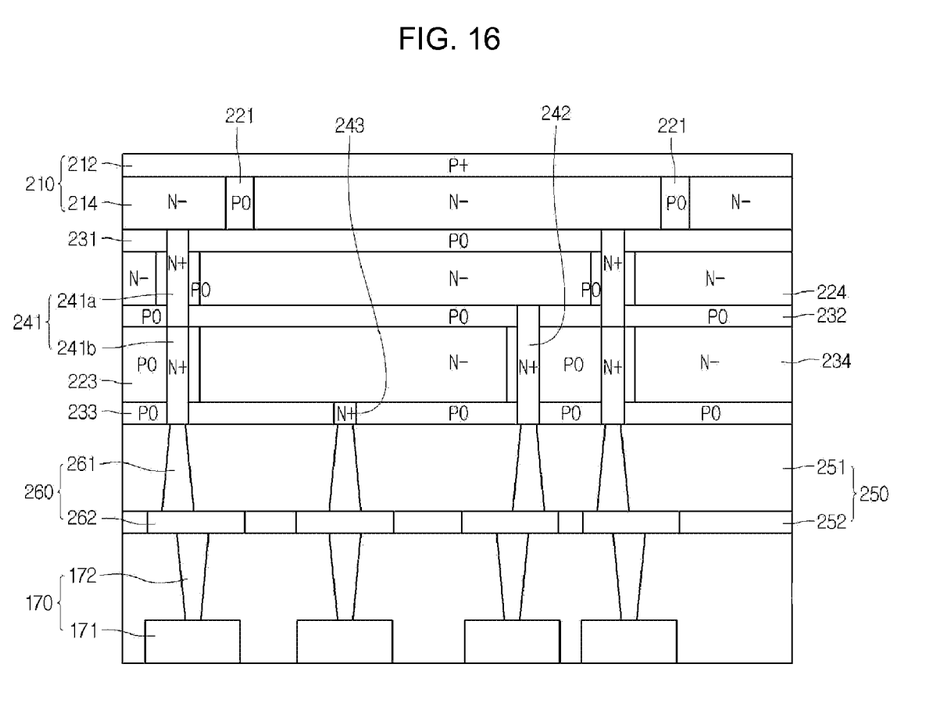

After that, as illustrated in FIG. 16, a lower portion of second substrate 200 may be removed while leaving the image sensing device remaining. For example, the P-Epitaxial layer at an upper portion of second substrate 200 can be removed by performing a cleaving or backside thinning process after the bonding of the first and second substrates.

After that, an uppermost layer of the photodiode 210, i.e., of P+ layer 212 may be connected to a ground line (not shown) during a subsequent process.

Figure 17:
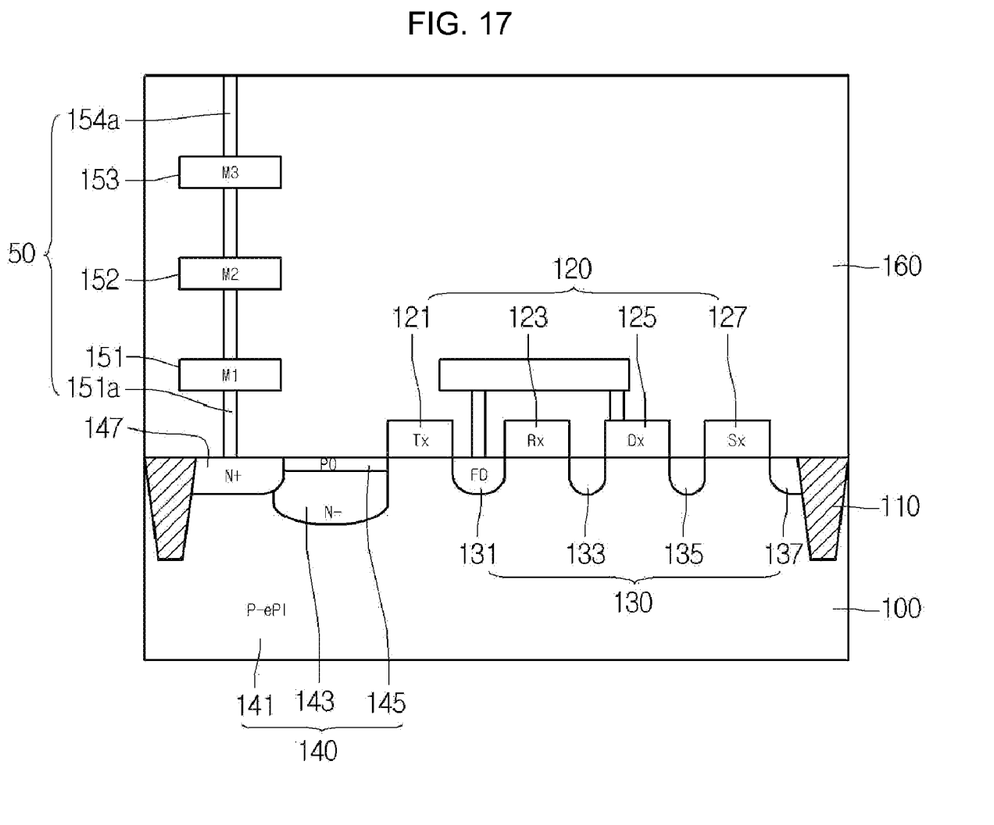

FIG. 17 is a sectional view of an image sensor in accordance with embodiments of the present invention, and is a detailed section view of a first substrate over which metal interconnection 150 may be formed.

Embodiments illustrated in FIG. 17 can adopt the technical characteristics of embodiments illustrated in example FIGS. 1 to 16.

For example, as illustrated in FIG. 17, an image sensor can increase a contact force between a photodiode and a metal interconnection and simultaneously obtain ohmic contact between the photodiode and the metal interconnection by bonding substrates with a dielectric interposed therebetween while increasing a fill factor.

The ion implantation contact layer for electron pick-up may be electrically connected to the photodiode for a corresponding color, and may simultaneously extend through the ion implantation isolation layer. Accordingly, a photodiode for one color can be electrically isolated from another pixel or photodiode for another color effectively in an aspect of structure and process.

In accordance with embodiments illustrated in example FIG. 10, a device may be designed such that there is a potential difference between the source and drain in both sides of transfer transistor (Tx), so that a photocharge can be fully dumped or transferred. Further, a charge connection region may be formed between a photodiode and readout circuitry to provide a swift movement path of a photocharge, so that a dark current source is minimized, and saturation reduction and/or sensitivity reduction can be reduced or prevented.

Unlike embodiments illustrated in FIGS. 1 to 16, first conduction type connection region 148 may be formed spaced laterally on one side of electrical junction region 140.

Alternatively, N+ connection region 148 for ohmic contact can be formed on P0/N−/P− junction 140. A process of forming N+ connection region 148 and M1 contact 151a may provide a leakage source because the device operates with a reverse bias applied to P0/N−/P− junction 140 and so an electric field (EF) can be generated on the Si surface. A crystal defect generated during the contact forming process inside the electric field may serve as a leakage source.

Also, in a case where N+ connection region 148 is formed on the surface of P0/N−/P− junction 140, an electric field can be generated due to N+/P0 junction 148/145. This electric field may also serve as a leakage source.

Therefore, embodiments of FIG. 17 propose a layout in which first contact plug 151a may be formed in an active region not doped with a P0 layer but including N+ connection region 148 and is connected to N-junction 143. An electric field can be prevented from being generated on the Si surface, which can contribute to reduction in a dark current of a 3D integrated CIS.

Although embodiments of the present invention described herein relate generally to a complementary metal oxide semiconductor (CMOS) image sensor, such embodiments are not limited to the same and may be readily applied to any image sensor requiring a photodiode.

Any reference in this specification to "one embodiment," "an embodiment," "exemplary embodiment(s)," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is within the purview of one skilled in the art to effect such feature, structure, or characteristic in connection with other embodiments.

Although certain embodiments of the present invention have been described herein, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
 a metal interconnection and readout circuitry over a first substrate;
 an image sensing device over the metal interconnection; and
 an ion implantation isolation layer in the image sensing device,
 wherein the image sensing device comprises:
  first, second and third color image sensing units stacked in or on a second substrate; and
  ion implantation contact layers electrically connected to the first, second and third color image sensing units, respectively.

2. The image sensor of claim 1, wherein the ion implantation contact layer extends through the ion implantation isolation layer.

3. The image sensor of claim 1, wherein the ion implantation isolation layer in the image sensing device comprises a first horizontal ion implantation isolation layer between first and second color image sensing units, and a second horizontal ion implantation isolation layer between second and third color image sensing units.

4. The image sensor of claim 3, wherein the ion implantation isolation layer in the image sensing device further comprises a vertical ion implantation isolation layer at an interface between pixels of each of the first, second and third color image sensing units.

5. The image sensor of claim 1, further comprising:
   a dielectric between the first substrate and the image sensing device; and
   a metal over the dielectric, the metal being electrically connected to the ion implantation contact layer.

6. The image sensor of claim 1, wherein the readout circuitry comprises an electrical junction region over the first substrate, the electrical junction region comprising:
   a first conduction type ion implantation region in the first substrate; and
   a second conduction type ion implantation region over the first conduction type ion implantation region.

7. The image sensor of claim 6, further comprising a first conduction type connection region over the electrical junction region, the first conduction type connection region being electrically connected to the metal interconnection.

8. The image sensor of claim 1, wherein the readout circuitry comprises a transistor having a potential difference between a source and a drain thereof.

9. The image sensor of claim 8, wherein the transistor comprises a transfer transistor, and the source of the transistor has an ion implantation concentration lower than a floating diffusion region.

10. The image sensor of claim 6, further comprising a first conduction type connection region formed spaced from the electrical junction region and electrically connected to the metal interconnection.

* * * * *